United States Patent [19]

Morgan

[11] 4,142,926
[45] Mar. 6, 1979

[54] SELF-ALIGNING DOUBLE POLYCRYSTALLINE SILICON ETCHING PROCESS

[75] Inventor: William L. Morgan, Sunnyvale, Calif.

[73] Assignee: Intel Corporation, Santa Clara, Calif.

[21] Appl. No.: 914,624

[22] Filed: Jun. 12, 1978

Related U.S. Application Data

[63] Continuation of Ser. No. 771,521, Feb. 24, 1977, abandoned, which is a continuation-in-part of Ser. No. 626,859, Oct. 29, 1975, abandoned.

[51] Int. Cl.$^2$ .................. H01L 21/22; H01L 21/308
[52] U.S. Cl. ........................ 148/187; 29/571; 29/578; 29/580; 156/628; 156/653; 156/657; 156/661; 156/662; 357/23; 357/59
[58] Field of Search .............. 156/628, 649, 653, 657, 156/661, 662; 148/175, 187; 29/571, 578, 580; 357/23, 59

[56] References Cited

U.S. PATENT DOCUMENTS

| | | | |
|---|---|---|---|
| 3,721,593 | 3/1973 | Hays et al. | 148/175 |
| 3,767,494 | 10/1972 | Muroaka et al. | 29/572 |
| 3,817,799 | 6/1974 | Schuter et al. | 156/649 |
| 3,897,282 | 7/1975 | White | 29/571 |
| 3,909,325 | 9/1975 | Church et al. | 156/662 |
| 3,940,288 | 2/1976 | Takagi et al. | 148/187 |
| 3,996,657 | 12/1976 | Simko et al. | 29/571 |

*Primary Examiner*—Jerome W. Massie
*Attorney, Agent, or Firm*—Blakely, Sokoloff, Taylor & Zafman

[57] ABSTRACT

A process for fabricating a double layer polycrystalline silicon structure for a metal-oxide-semiconductor (MOS) integrated circuit. The upper polycrystalline silicon layer after being etched to form a predetermined pattern is used as a masking member for etching the lower polycrystalline silicon layer, thereby assuring alignment between the layers. A selective etchant which discriminates between the silicon layers is employed.

12 Claims, 12 Drawing Figures

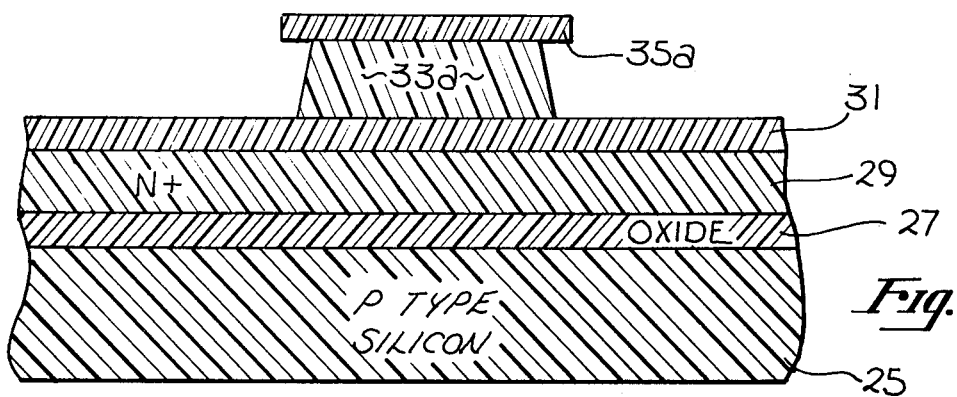
_Fig. 4_
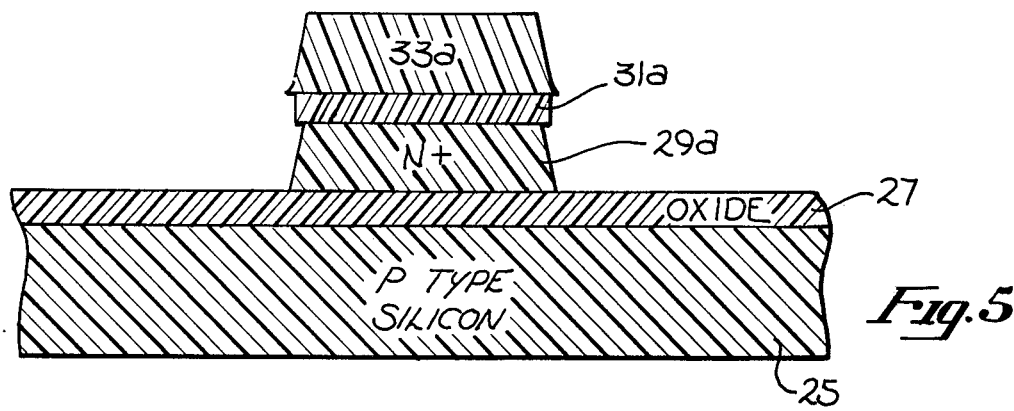
_Fig. 5_
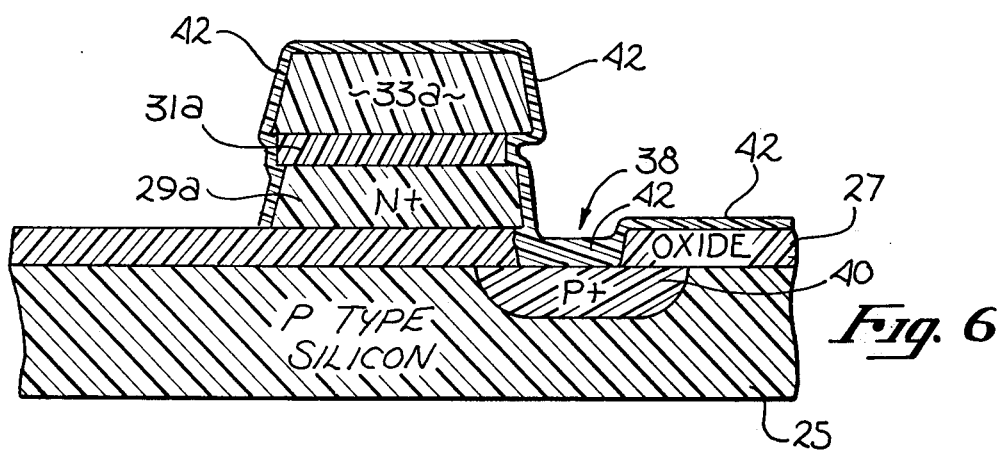
_Fig. 6_
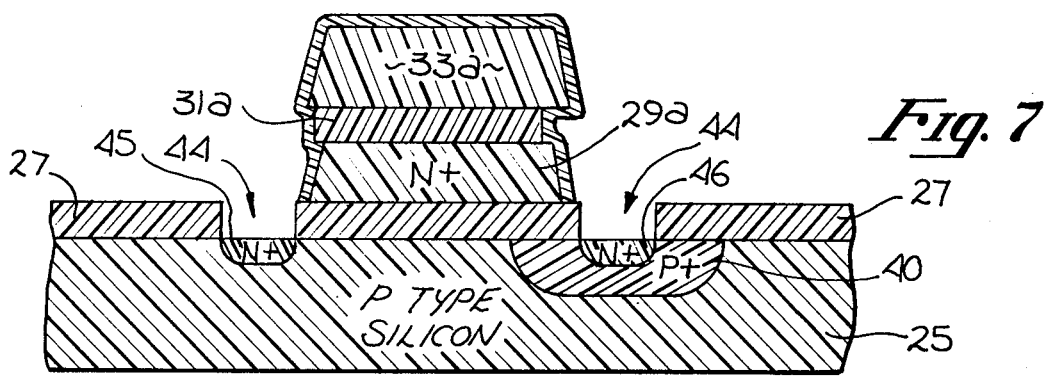
_Fig. 7_

SELF-ALIGNING DOUBLE POLYCRYSTALLINE SILICON ETCHING PROCESS

This is a continuation of application Ser. No. 771,521, filed 2/24/77, now abandoned, which is a continuation-in-part of Ser. No. 626,859, filed Oct. 29, 1975, now abandoned.

BACKGROUND OF THE INVENTION

1. Field of the Invention

The invention relates to the fabricating of integrated circuits which employ double polycrystalline silicon layers.

2. Prior Art

In some MOS integrated circuits double polycrystalline silicon layers are employed for forming numerous circuit structures. Typically, a first or lower layer of polycrystalline silicon is insulated from a silicon substrate by an oxide layer with a second oxide layer insulating the lower silicon layer from an upper or second layer of polycrystalline silicon. These layers are fabricated into memory devices such as those employing floating gates, capacitors, interconnecting lines and others, with known photolithographic techniques. Such technology is presently employed in commercially available charged-coupled devices and programmable read-only memories.

In some of these double polycrystalline integrated circuit structures, it is desirable to have a member formed from the upper layer in alignment with a member formed from the lower layer. For example, where the upper and lower layers are used to define gates in field-effect devices, alignment between the gates may be important. With prior art fabrication processes, it is difficult to achieve such alignment. A prior art structure will be described in conjunction with FIG. 1 to illustrate one method by which the prior art indirectly solves this alignment problem.

SUMMARY OF THE INVENTION

The described invention is employed in the fabrication of an MOS integrated circuit employing double polycrystalline silicon layers. A first layer of polycrystalline silicon is disposed on a substrate followed by the formation of a second layer of polycrystalline silicon above the first silicon layer. The invented process provides for the formation of a circuit structure in the first silicon layer in alignment with a circuit structure in the second silicon layer. A structure is first defined in the second silicon layer, this structure is then used as a masking member for etching the first silicon layer. An etchant which discriminates between the first and second silicon layer is employed. In this manner, the structure etched in the first silicon layer is in alignment with the structure of the second silicon layer.

BRIEF DESCRIPTION OF THE DRAWINGS

FIGS. 2 through 7 illustrate the various steps in the invented process, particularly for the fabrication of a memory device.

FIG. 2 is a cross-sectional elevation view of a substrate with a first layer of polycrystalline silicon.

FIG. 3 illustrates the substrate of FIG. 2 with a second layer of polycrystalline silicon formed above the first layer.

FIG. 4 illustrates the substrate of FIG. 3 with a first structure fabricated by photolithographic techniques in the second silicon layer.

FIG. 5 illustrates the substrate of FIG. 4 with the first silicon layer etched where the first structure of the second layer is employed as a masking member.

FIG. 6 illustrates the substrate of FIG. 5 with an opening through a gate oxide layer and with an impurity well formed within the substrate through the opening.

FIG. 7 illustrates the substrate of FIG. 6 with a source and drain region defined within the substrate.

DETAILED DESCRIPTION OF THE INVENTION

A process and method is disclosed for fabricating MOS integrated circuit structures and members from double layers of polycrystalline silicon. The invented process permits fabrication of polycrystalline silicon structures from a first and second silicon layer which are in alignment with one another. By way of example, where the structures are upper and lower gates of field-effect devices, source and drain regions may then be fabricated within the substrate in alignment with both gates. The process is described in conjunction with the fabrication of a floating gate memory device where the structure of the first and second layer are gates, however, it will be apparent to one skilled in the art that the process may be employed for forming other integrated circuit members and elements such as capacitors, interconnecting lines, and others. Moreover, while the process is described with double or two layers of polycrystalline silicon, it may be useful in forming circuits employing more than two layers of polycrystalline silicon.

As will be appreciated in the description of the invented process set forth below, numerous details which are well known in the art have not been included in order not to over complicate this disclosure. Moreover, some of the details which are included are not necessary to practice this invention, but rather are included to assist in explaining the invention.

Figure 1:
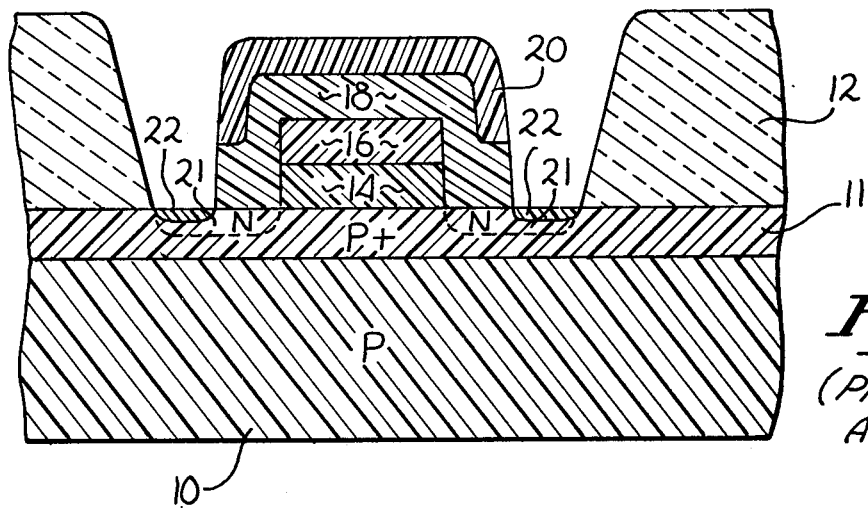
FIG. 1 is a cross-sectional elevation view of an MOS floating gate device employing a double layer polycrystalline silicon structure. This figure demonstrates a prior art problem associated with double layers of polycrystalline silicon where a structure of one silicon layer is not in alignment with the structure of the second silicon layer.

Referring first to FIG. 1, a prior art MOS double polycrystalline silicon floating gate device is illustrated on a p-type substrate 10. The upper surface of the substrate 10 is ion implanted forming the host region 11 for the floating gate device. The device includes a gate oxide 14 disposed between the upper surface of the substrate and a floating gate 16; this gate comprises polycrystalline silicon. In the fabrication of this device an oxide layer and polycrystalline silicon layer are formed on the upper surface of the substrate. The gate 16 and oxide layer 14 are then formed from these layers with known photolithographic techniques. The lightly doped n-type regions 21 are next defined in alignment with this gate and oxide. Following this, another oxide layer and polycrystalline silicon layer are disposed above the floating gate 16 and etched to define the oxide 18 and the upper or control gate 20. After the formation of the control gate 20 n-type regions 22 are formed within regions 21 in alignment with the control gate 20. For a detail discussion of the fabrication and use of the device of FIG. 1 see U.S. Pat. No. 3,996,657.

Ideally both gates 16 and 20 should be in alignment, thereby allowing the formation of the n-type regions in alignment with both gates. This is difficult to achieve however, because of the misalignment tolerance involved in aligning the mask for gate 20 with gate 16. Since gate 20 is not in alignment with gate 16, two separate doping steps are required to define the source and drain regions of this device. Moreover, gate 20 is larger in area than gate 16 increasing the device area.

As will be described, when the device of FIG. 1 is fabricated employing the presently invented process, the control gate and floating gate are in alignment, thus only a single doping step is required to form the source and drain regions. Moreover, the area required for the device is reduced allowing denser fabrication.

Figure 2:
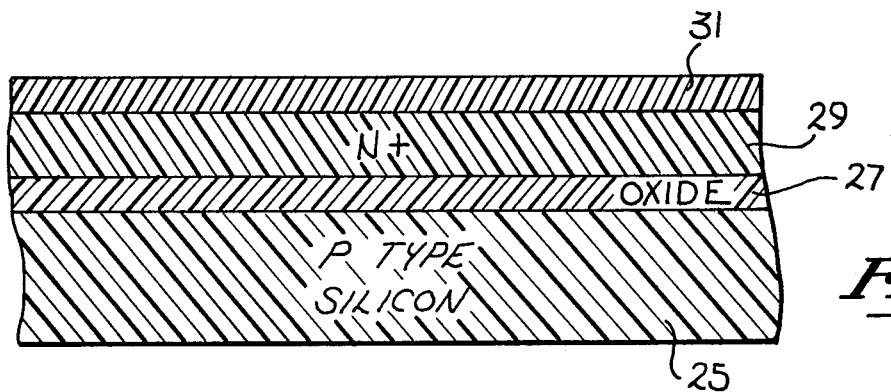

Referring now to FIG. 2 a substrate 25 is illustrated which for the described embodiment comprises a p-type silicon. A silicon oxide layer 27 is grown on the upper surface of the silicon substrate 25; disposed on the upper surface of this oxide layer 27 is a first or lower polycrystalline silicon layer 29. For the described embodiment, layer 29 is heavily doped with an n-type dopant, such as phosphorus, in a standard diffusion step. A second oxide layer 31 is grown on the exposed surface of the first polycrystalline silicon layer 29. By way of example, the oxide layers 27 and 31 may be between 500 and 1,000Å in thickness, and the first silicon layer 29 may be between 4,500 and 6,000Å in thickness. The substrate and the layers disposed thereon of FIG. 2 are equivalent to the substrate 10 of FIG. 1 and the oxide layer and polycrystalline silicon layer used to fabricate the gate oxide 14 and floating gate 16 of FIG. 1.

Figure 3:
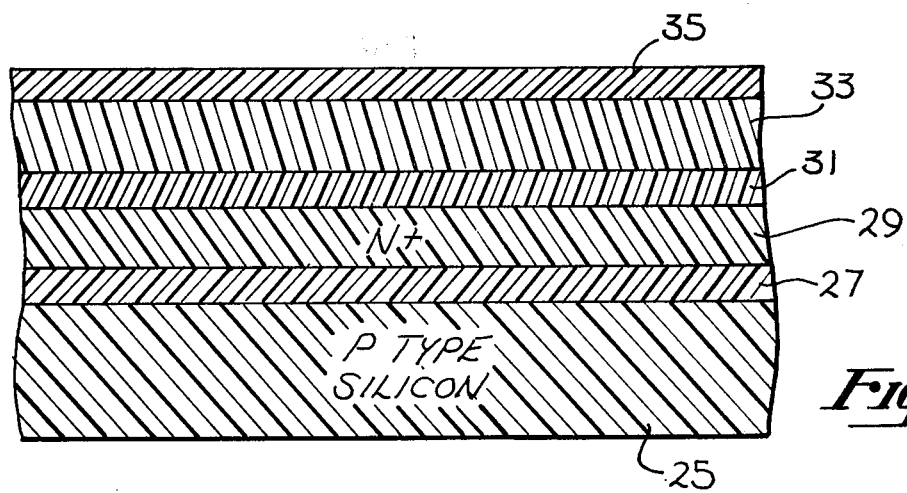

In FIG. 3 the substrate of FIG. 2 is illustrated after a second polycrystalline silicon layer 33 is formed on the upper surface of the oxide layer 31 followed by the growth of an oxide layer 35 on the upper surface of the silicon layer 33. These layers may be formed in a conventional manner. The formation of these layers on the oxide layer 31 is a departure from the prior art process described in conjunction with FIG. 1 where the floating gate 16 is entirely etched prior to the formation of the second polycrystalline layer. It will be appreciated that in FIGS. 2 through 7 only one cross-section of the device is shown. The first polycrystalline silicon layer 29 may be masked and etched (such as between devices) in other areas of the substrate 25 and hence layer 29 may not be coextensive with layer 33. FIGS. 2 throuh 7 primarily illustrate the gate region of the floating gate device. Where the first layer of silicon 29 has been etched an oxidation step may be required to insulate these etched regions. Thus, layer 31 of FIG. 3 may be a different oxide where the layer 31 of FIG. 3 is regrown. In FIGS. 8 through 12 the process of the present invention is illustrated where other devices which employ only a single layer of silicon are simultaneously formed on the substrate.

After the formation of the oxide layer 35, a masking member is defined in this layer; this member is shown as masking member 35a in FIG. 4. This masking member conforms to a predetermined pattern and may be fabricated, again employing known photolithographic techniques. Following the formation of this masking member the polycrystalline layer 33 is etched by subjecting the layer to known silicon etchants to form an upper gate 33a as shown in FIG. 4.

After the upper gate 33a has been formed, the exposed portions of the oxide layer 31 and the masking member 35a are removed with known oxide etchants. Then the first layer of polycrystalline silicon is etched to form the lower gate 29a as shown in FIG. 5. During this etching step the upper gate 33a acts as a masking member assuring that the lower gate 29a is in alignment with the upper gate as is illustrated in FIG. 5.

In the presently preferred embodiment a selective etchant is used for etching the silicon layer 29. The etchant discriminates between the doped and undoped polycrystalline silicon, removing only the doped silicon, while leaving the upper gates 33a substantially untouched. The resultant structure as shown in FIG. 5 includes the lower gate 29a, and upper gate 33a and a gate oxide 31a disposed between the lower and upper gates. For the described embodiment, the etchant includes hydrofluoric acid, nitric acid and acetic acid. This etchant provides the necessary discrimination and only etches the phosphorus doped polycrystalline silicon.

While for the described embodiment the lower layer of polycrystalline silicon is doped and the upper layer is undoped, other combinations of doped and undoped layers may be employed. In such cases the upper layer is first etched to define a polycrystalline silicon structure, and this structure is then used as a masking member for the etching of the lower layer. By way of example, the lower layer may be undoped with a boron (p-type) doped upper silicon layer. An etchant of hot KOH may then be used to selectively remove the undoped polycrystalline silicon lower layer. This particular etchant does not substantially affect the doped silicon of the upper layer. This etchant may also be used where the lower layer is lightly doped with a p-type dopant and the upper layer is heavily doped.

It may be possible in some structures to employ a p-type dopant in the lower layer and an undoped or n-type doped upper layer. An etchant comprising $CrO_3$, hydrofluoric acid and water (SIRTL) may be employed for etching the lower layer.

The disclosed process may also be employed without the use of an etchant which discriminates between doped and undoped polycrystalline silicon, however, this is not the preferred embodiment. In this case the oxide layer 35 of FIG. 3 is grown to a thickness greater than the oxide layer 31, for example, 3000Å. Then this thicker oxide layer is formed into a mask, such as a masking member 35a of FIG. 4. Next the upper layer of silicon is etched in an ordinary manner to form the gate 33a, as is shown in FIG. 4. Following this the exposed portions of the oxide layer 31 are removed with an ordinary oxide etching step. Since the masking member 35a is thicker than the layer 31, the etchant leaves a masking member 35a on the gate 33a. Then the lower silicon layer is etched in a silicon etchant step. During this etching the masking member 35a protects the upper surface of the gate 33a while the sides of the upper gate 33a act as a masking member. As will be appreciated while the lower layer is etched, additional undercutting occurs beneath the masking member 35a, however the resultant gates are aligned. Undercutting may be substantially reduced, as known in the art, by employing plasma etching.

Where the structure of FIG. 5 is to be fabricated into a floating gate memory device, an opening 38 is formed adjacent to the gates 29a and 33a through the oxide layer 27. Following this, through boron ion implantation a well is formed through the opening 38. Then with an oxidation driver step the impurities in this well are diffused to beyond the perimeter of the opening 38 to form the p-type well 40 illustrated in FIG. 6. During this oxidation driver step, an oxide 42 is formed as shown in FIG. 6.

Following the formation of the p-type well 40, a pair of spaced-apart openings 44 are etched adjacent to the gates 29a and 33a through the oxide layer 27. An n-type dopant such as phosphorus is then used to form the source region 45 and the drain region 46. The formation of the openings 38 and 44, the p-type well 40, and the source and drain regions 45 and 46 may be accomplished with known MOS processing procedures. In the presently preferred process a masking step is not required to form openings 44.

While for the embodiment shown in FIGS. 6 and 7, a p-type well 30 is employed, such a well is not required for the formation of the memory device where either the substrate 25 is more heavily doped, or where the upper surface of the substrate is ion implanted to form a host region for the device. For example, with the device of FIG. 1, rather than employing a p-type well, the upper surface of the substrate was ion implanted (region 11).

Employing the invented process in the fabrication of the device of FIG. 7 yield several advantages over the prior art device of FIG. 1. First, the performance of the device of FIG. 7 is not a function of the masking alignment associated with the fabrication of the upper gate. Better performance results from the alignment achieved with the invented process. Moreover, the device size may be decreased with the invented process since the upper gate is not larger than the lower gate. To correct for masking tolerances the upper gate of the device of FIG. 1 is larger than the lower gate.

A plurality of the devices illustrated in FIG. 7 are utilized in a PROM, where the PROM forms part of a single-chip digital computer. In this embodiment the p-type wells, such as well 40, are not utilized, but rather the host region for the devices is ion implanted. See co-pending application Ser. No. 636,535 filed Dec. 1, 1975, now abandoned, entitled "Electrically Programmable Single Chip MOS Computer," assigned to the assignee of this application.

Figure 8:
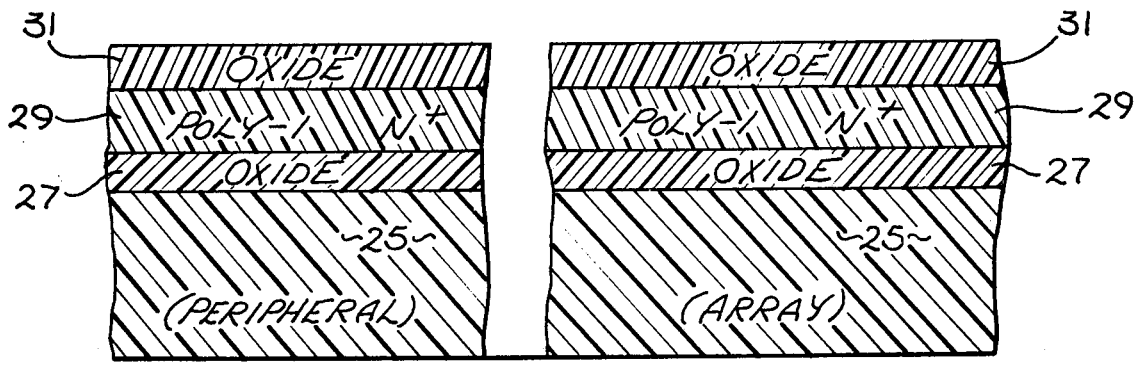
FIG. 8 is a cross-sectional elevation view of two sections of a substrate, one of which is employed for the array of a memory and the other for the peripheral circuitry.
Figure 9:
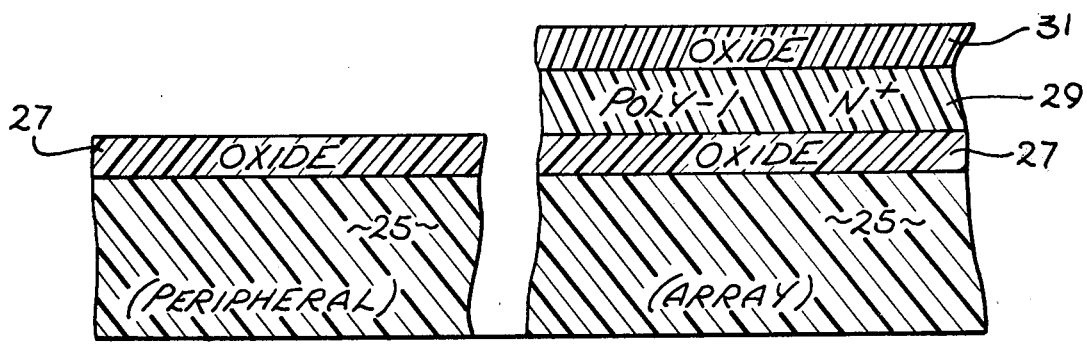
FIG. 9 illustrates the substrate of FIG. 8 with a first polycrystalline layer removed from one section of the substrate.

The above described process may be used while other devices not employing two layers of polycrystalline silicon are simultaneously fabricated on the substrate. For example, where the floating gate devices of FIG. 7 are employed for storage in an array, ordinary field-effect transistors for peripheral circuits may be simultaneously fabricated on the same substrate. In FIG. 8 two sections of the substrate 25 are illustrated. The right-hand section is labeled "array." The fabrication of a floating gate device in the manner previously described will again be shown in FIGS. 8 through 12 on this section of the substrate. On the other section of the substrate, labeled "peripheral," the formation of a device which employs only one layer of polycrystalline silicon, such as an ordinary field-effect transistor, is shown.

In FIG. 8 the gate oxide or first oxide layer 27 is again illustrated along with the doped first layer of polycrystalline silicon 29. This layer has been labeled "POLY-1" in FIGS. 8 through 12. The second oxide layer 31 is also illustrated. The substrate 25 of FIG. 8 is in the same stage of processing as the substrate of FIG. 2.

Before the second layer of polycrystalline silicon is formed on the substrate, the first layer of silicon is removed from the section of the substrate which will contain the peripheral circuitry. (The first layer is also removed between the floating gate devices in the array to allow these devices to be separated one from the other.) The first layer of silicon may be removed by masking the array section of the substrate and then by employing ordinary etchants to etch portions of the oxide layer 31 and silicon layer 29. The regrowth of oxide layers used to protect exposed portions of layer 29 is not shown. Moreover, for the fabrication of some devices exposed regions of layer 27 and layer 31 may be removed and regrown as part of a process to ion implant regions of the substrate.

Figure 10:
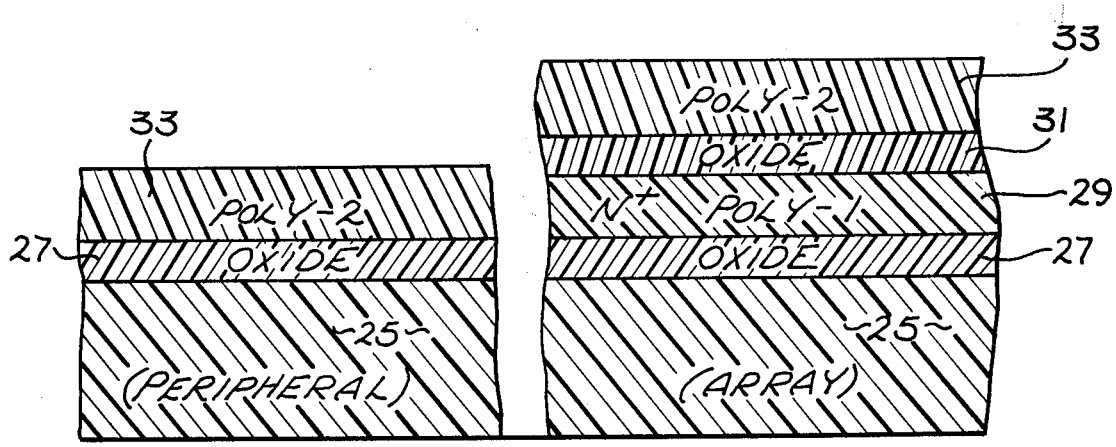
FIG. 10 illustrates the substrate of FIG. 9 with a second polycrystalline silicon layer formed on the substrate.

Next, the second layer of polycrystalline silicon 33 (POLY-2) is formed on the substrate as shown in FIG. 10. In the array section of the substrate, the second layer of polycrystalline silicon is formed on the oxide layer 31, as shown in FIG. 3. In the peripheral section of the substrate, the second layer of polycrystalline silicon is formed on the gate oxide 27.

Figure 11:
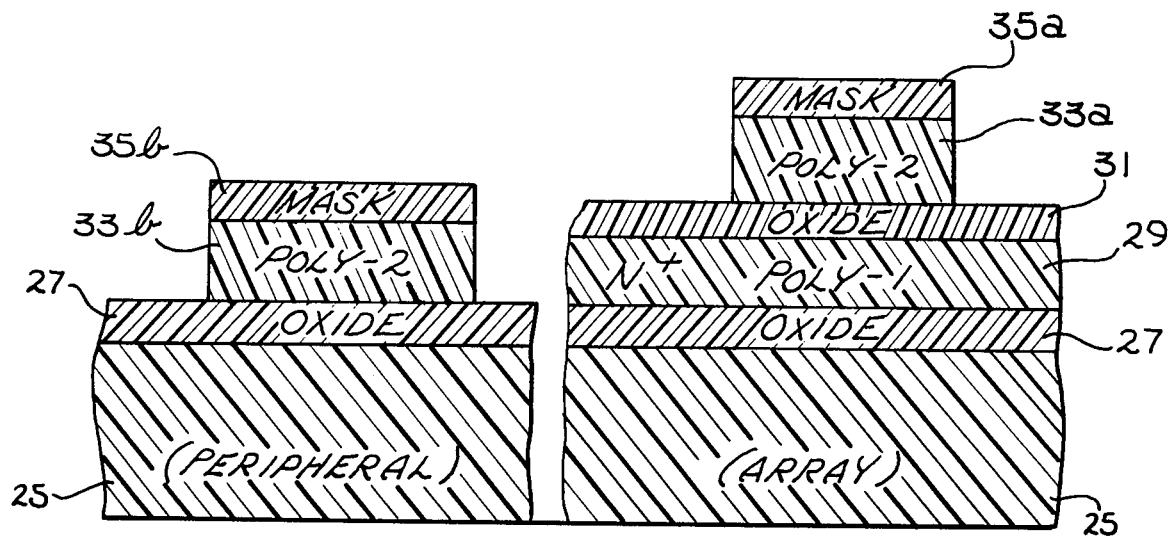
FIG. 11 illustrates the substrate of FIG. 10 with the second polycrystalline silicon layer etched.

Now masking members may be simultaneously formed to permit etching of the silicon layer 33 (FIG. 11). A masking member 35a is employed to define the silicon member 33a, while a masking member 35b is used to define a silicon member 33b. This step corresponds to FIG. 4 above.

Figure 12:
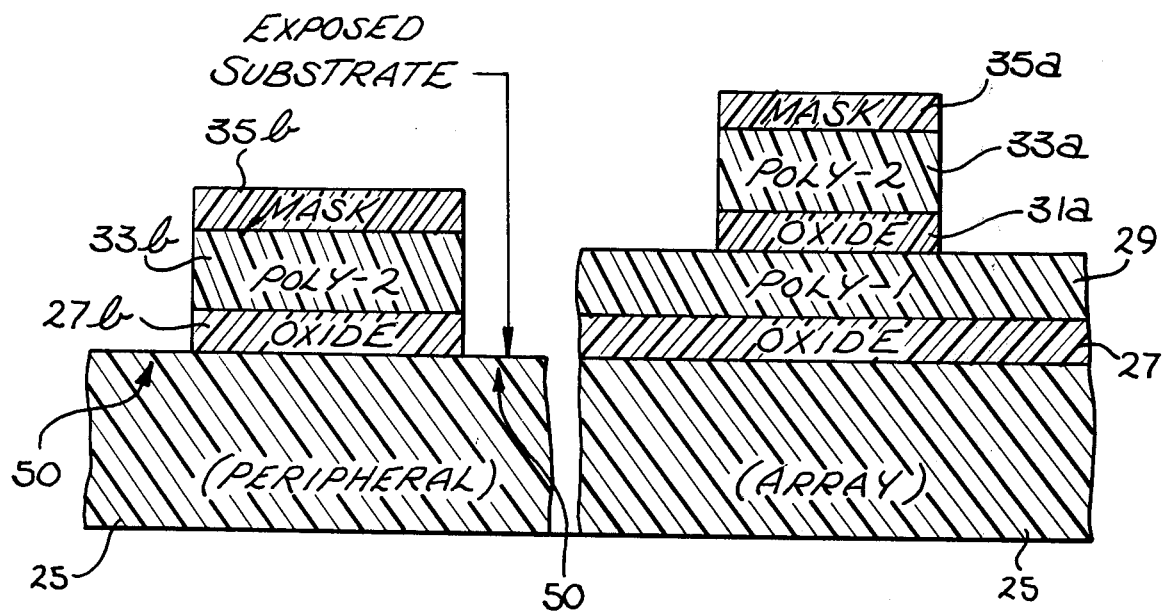
FIG. 12 illustrates the substrate of FIG. 11 with an oxide layer etched exposing a portion of the substrate and a portion of the first polycrystalline layer.

An oxide etchant is employed to etch the layer 31 in alignment with the silicon member 33a as shown in FIG. 12. During this etching step the oxide layer 27 in the peripheral section of the substrate is simultaneously etched in alignment with the slicon member 33b. Note that the masking members 35a and 35b may be removed before the oxide layers 27 and 31 are etched, or may remain on members 33a and 33b and be removed after layer 29 is etched to form the floating gates.

As shown in FIG. 12, when the oxide layer 27 in the peripheral section of the substrate is etched, portions of the substrate (shown as regions 50) are exposed. If an ordinary etchant is now employed to etch the silicon layer 29 in the array section of the substrate to form the member 29a of FIG. 5, this etchant will etch the substrate 50. This may result in deeper source and drain regions, and other problems. However, by employing an etchant which discriminates between the doped silicon layer and the undoped silicon layer and lightly doped (p-type) substrate, the etchant etches the layer 29 without etching either the substrate or the silicon members 33a and 33b. (The lightly doped p-type substrate employed is not etched by the etchant comprising hydrofluoric acid, nitric acid and acetic acid). Thus the described process may readily be employed to fabricate memories where an array and the peripheral circuits are included on the same silicon substrate.

Thus, a self-aligning double polycrystalline silicon process has been disclosed which assures alignment between structures in different polycrystalline silicon layers.

I claim:

1. A process for fabricating an MOS, double polycrystalline integrated circuit structure at a predetermined area of a silicon substrate comprising the steps of:

forming a continuous first silicon oxide layer on said substrate covering at least said area;

forming a doped first polycrystalline silicon layer on said first oxide layer such that said first silicon layer is insulated from said substrate at said area;

forming a second oxide layer on said doped first silicon layer;

forming a second polycrystalline silicon layer on said second oxide layer;

etching said second slicon layer and said second oxide layer above said area to form a structure having a predetermined pattern;

subjecting said doped first silicon layer and said structure to an etchant which discriminates between said doped first silicon layer and said second silicon layer employing said structure as a mask;

whereby a double polycrystalline silicon structure is formed on said substrate at said area.

2. The process defined by claim 1 wherein said doped first polycrystalline silicon layer is doped with phosphorus.

3. The process defined by claim 1 wherein said first silicon layer is between 4,500 and 6,000Å in thickness.

4. The process defined by claim 3 wherein said first silicon oxide layer is between 500 and 1,000Å in thickness.

5. The process defined by claim 1 wherein said etchant comprises hydrofluoric acid, nitric acid and acetic acid.

6. A process for fabricating an MOS double polycrystalline silicon integrated circuit structure at a predetermined area on a silicon substrate comprising the steps of:

forming a continuous first silicon oxide layer on said substrate covering at least said area;

forming a first polycrystalline silicon layer on said first oxide layer such that said first silicon layer is insulated from said substrate at said area;

forming a second oxide layer on said first polycrystalline silicon layer;

forming a doped second polycrystalline silicon layer on said insulative layer;

etching said doped second polycrystalline silicon layer and said second oxide layer above said area to form a structure having a predetermined pattern;

subjecting said first silicon layer and said structure to an etchant which discriminates between said doped second silicon layer and said first silicon layer so as to etch only said second silicon layer employing said structure as a mask;

whereby a double polycrystalline silicon structure is formed on said substrate at said area.

7. The process defined by claim 6 wherein said doped second polycrystalline silicon layer is doped with boron.

8. The process defined by claim 7 wherein said etchant comprises hot KOH.

9. A process for fabricating an MOS floating gate memory device at a predetermined area on a silicon substrate, said substrate including a first continuous silicon oxide layer covering at least said area and a first polycrystalline silicon layer disposed on said first silicon oxide layer such that said first polycrystalline silicon layer is insulated from said substrate at said area comprising the steps of:

doping a said first polycrystalline silicon layer;

forming a second oxide layer on said first silicon layer;

forming a second silicon layer on said second oxide layer;

fabricating a gate masking member at said area on said second silicon layer;

etching said second silicon layer to form an upper gate;

removing exposed portions of said second oxide layer; and, subjecting said first and second silicon layers to an etchant which discriminates between said doped first silicon layer and said second silicon layer so as to etch only said first silicon layer to form a lower gate;

whereby said upper gate acts as a mask during the etching of said lower gate, thereby assuring that said lower gate is in alignment with said upper gate.

10. The process defined by claim 9 including the formation of a source and drain region in said substrate adjacent to said gates.

11. The process defined by claim 10 wherein the dopant employed for said doping of said first silicon layer comprises phosphorus.

12. The process defined by claim 11 wherein said source and drain regions comprise n-type regions.

REEXAMINATION CERTIFICATE (56th)

United States Patent [19]
Morgan

[11] B1 4,142,926
[45] Certificate Issued Mar. 8, 1983

[54] SELF-ALIGNING DOUBLE POLYCRYSTALLINE SILICON ETCHING PROCESS

[75] Inventor: William L. Morgan, Sunnyvale, Calif.

[73] Assignee: Intel Corporation, Santa Clara, Calif.

Reexamination Request
No. 90/000,008, Jul. 1, 1981

Reexamination Certificate for:
Patent No.: 4,142,926
Issued: Mar. 6, 1979
Appl. No.: 914,624
Filed: Jun. 12, 1978

Related U.S. Application Data

[63] Continuation of Ser. No. 771,521, Feb. 24, 1977, abandoned, which is a continuation-in-part of Ser. No. 626,859, Oct. 29, 1975, abandoned.

[51] Int. Cl.³ .................. H01L 21/22; H01L 21/308
[52] U.S. Cl. ... 148/187; 29/571; 29/578; 29/580; 156/628; 156/653; 156/657; 156/661.1; 156/662; 357/23; 357/59
[58] Field of Search ....... 156/653, 657, 156/659.1 661.1, 628, 662; 148/1.5, 187; 357/41, 53, 357/59, 23; 29/571, 580

[56] References Cited

U.S. PATENT DOCUMENTS

| | | |
|---|---|---|
| 3,721,593 | 3/1973 | Hays et al. |
| 3,865,652 | 2/1975 | Agusta et al. |
| 3,918,149 | 11/1975 | Roberts. |
| 3,940,288 | 2/1976 | Takagi et al. |

FOREIGN PATENT DOCUMENTS

813537   5/1969   Canada.

OTHER PUBLICATIONS

Verwey et al., "Atmos—An Electrically Reprogrammable Read-Only Memory Device", *IEEE Transactions on Electron Devices*, vol. Ed-21, No. 10, October 1974.

*Primary Examiner*—William A. Powell

[57] ABSTRACT

A process for fabricating a double layer polycrystalline silicon structure for a metal-oxide-semiconductor (MOS) integrated circuit. The upper polycrystalline silicon layer after being etched to form a predetermined pattern is used as a masking member for etching the lower polycrystalline silicon layer, thereby assuring alignment between the layers. A selective etchant which discriminates between the silicon layers is employed.

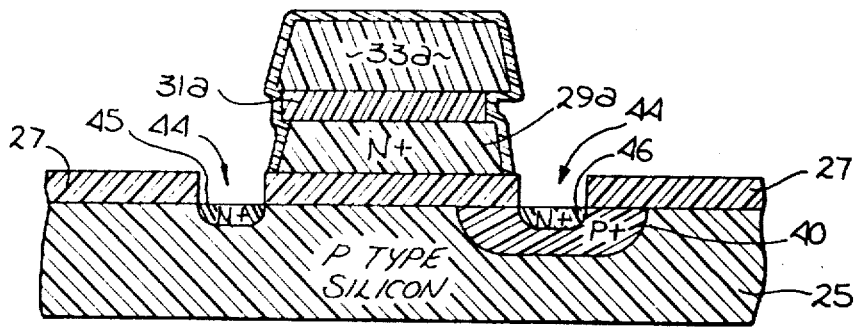

REEXAMINATION CERTIFICATE ISSUED UNDER 35 U.S.C. 307.

NO AMENDMENTS HAVE BEEN MADE TO THE PATENT.

AS A RESULT OF REEXAMINATION, IT HAS BEEN DETERMINED THAT:

The patentability of claims 1-12 is confirmed.

* * * * *